US006960782B2

(12) United States Patent
Allenspach et al.

(10) Patent No.: US 6,960,782 B2
(45) Date of Patent: Nov. 1, 2005

(54) ELECTRONIC DEVICES WITH FULLERENE LAYERS

(75) Inventors: Rolf Allenspach, Adliswil (CH); Urs T. Duerig, Rueschlikon (CH); Walter Riess, Adliswil (CH); Reto Schlittler, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 10/425,135

(22) Filed: Apr. 28, 2003

(65) Prior Publication Data

US 2004/0016922 A1 Jan. 29, 2004

(30) Foreign Application Priority Data

Apr. 30, 2002 (EP) ........................................... 02009742

(51) Int. Cl.[7] ............................................... H01L 29/12

(52) U.S. Cl. ......................... 257/40; 257/485; 257/613; 257/657; 977/DIG. 1

(58) Field of Search ......................... 257/40, 485, 613, 257/655, 657; 977/DIG. 1

(56) References Cited

U.S. PATENT DOCUMENTS 5,171,373 A * 12/1992 Hebard et al. ................ 257/40
5,331,183 A 7/1994 Sariciftci et al.
5,391,323 A * 2/1995 Haddon et al. ............. 257/613
5,454,880 A 10/1995 Sariciftci et al.
5,637,260 A * 6/1997 Okuda et al. ............... 252/506
6,750,471 B2 * 6/2004 Bethune et al. ............... 257/40

* cited by examiner

*Primary Examiner*—Gene M. Munson
(74) *Attorney, Agent, or Firm*—Wan Yee Cheung

(57) ABSTRACT

Described is an electronic device comprising a junction formed between a first fullerene layer having a first doping concentration and a second fullerene layer having a second doping concentration different from the first doping concentration. The first doping concentration may be zero. The first and/or the second fullerene layer may be a monolayer. The second fullerene layer may comprise an electron donor. One example of such a device is a diode wherein the first fullerene layer is connected to an anode and the second fullerene layer is connected to a cathode. Another example is a field effect transistor wherein the first fullerene layer serves as a gate region and the second fullerene layer serves as a channel region. The second fullerene layer may alternatively comprise an electron acceptor. At least one of the first and second fullerene layers may be formed from C60, or may consist of a single bucky ball.

20 Claims, 4 Drawing Sheets

ELECTRONIC DEVICES WITH FULLERENE LAYERS

CROSS-REFERENCE TO RELATED APPLICATIONS

The present invention claims priority to European Application Number 02009742.4, "Electronic Devices", filed on Apr. 30, 2002, now abandoned. The EP application is herein incorporated by reference in its entirety.

FIELD OF THE INVENTION

The present invention generally relates to electronic devices and particularly relates to electronic devices based on fullerenes and method of making such devices.

BACKGROUND OF THE INVENTION

Ultra-small electronic devices on the nanometer have been the subject of considerable exploratory research. For example, U.S. Pat. No. 5,331,183 describes heterojunctions, diodes, photodiodes, and photovoltaic cells each based on a junction between a conjugated polymer and a fullerene, such as Buckminsterfullerene, C60. The polymer forms a p-type semiconductive donor layer and the fullerene forms an n-type semiconductive acceptor layer. Charge separation in the junction occurs on illumination of the junction.

SUMMARY OF THE INVENTION

In accordance with the present invention, there is now provided an electronic device comprising a junction formed between a first fullerene layer having a first doping concentration and a second fullerene layer having a second doping concentration different from the first doping concentration.

The first doping concentration may be zero. The second fullerene layer may be a monolayer. Similarly, the first fullerene layer may be a monolayer. The second fullerene layer may comprise an electron donor dopant such as an alkali metal. The second doping concentration may be in the region of $10^{21}$ per $cm^3$. In a preferred embodiment of the present invention, the device is in the form of a diode wherein the first fullerene layer is connected to an anode and the second fullerene layer is connected to a cathode. In another preferred embodiment of the present invention, the device is in the form of a field effect transistor wherein the first fullerene layer serves as a gate region and the second fullerene layer serves as a channel region extending between a source terminal and a drain terminal. The second fullerene layer may alternatively comprise an electron acceptor dopant. At least one of the first and second fullerene layers may be formed from C60. It should be appreciated that at least one of the first and second fullerene layers may consist of a single bucky ball.

Viewing the present invention from another aspect, there is now provided, a method for fabricating an electronic device comprising forming a junction between a first fullerene layer having a first doping concentration and a second fullerene layer having a second doping concentration different from the first doping concentration.

In a preferred embodiment of the present invention, there is provided a semiconductor/metal combination. By varying the ratio between the semiconductor and the metal, the electrical properties of the device can be adjusted. No illumination is needed to render the device operable.

Preferred embodiments of the present invention will now be described, by way of example only, with reference to the accompanying drawings, in which:

DETAILED DESCRIPTION OF THE INVENTION

Preferred embodiments of the present invention to be described shortly include nanometer sized structures that operate as elements for electronic circuits on the nanometer scale. The structures described by way of example are based on combinations of fullerenes in pure form with fullerenes doped with a metal. In particularly preferred embodiments of the present invention, doped exohedral and endohedral fullerenes such as Li@C60 and La@C82 are employed. Other embodiments of the present invention may include both semiconducting and/or metallic carbon nanotubes. The present invention advantageously facilitates the fabrication of circuit elements on a 1 nm scale because the typical length scale in fullerenes is 0.7 nm, which is the diameter of a single bucky ball.

Figure 1:
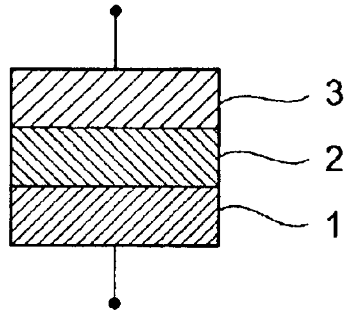
FIG. 1 is a cross sectional view of a diode embodying the present invention.

Referring first to FIG. 1, in a preferred embodiment of the present invention, there is provided a Schottky diode comprising an undoped fullerene layer 2 and a doped fullerene layer 3 on a metal substrate 1, with the undoped fullerene layer 2 disposed between the metal substrate 1 and the doped fullerene layer 3. The substrate 1 is formed from Au(110). The undoped fullerene layer 2 is a two molecule thick layer of C60. Experimental results to be described shortly demonstrate that C60 is semiconducting. The doped fullerene layer 3 is a 1 molecule thick layer of lithium doped C60 (Li@C60). One molecule thick layers are usually and will hereinafter be referred to as monolayers.

The doping of the fullerenes constituting the doped fullerene layer 3 is in the concentration of $10^{21}$ per $cm^3$ or one Li atom per C60. Li@C60 is an n-type material. However, experimental results to be described shortly demonstrate that Li@C60 in the aforementioned concentration is surprisingly metallic in behavior. More surprisingly, experimental results to be described shortly demonstrate that the doped/undoped fullerene junction of the diode hereinbefore described exhibits an I/V curve which is characteristic of a diode. In operation, the undoped fullerene layer 2 is connected to the anode of the diode and the doped fullerene layer 3 is connected to the cathode of the diode. This demonstrates that electronic devices can be fabricated based on junctions between metal doped fullerenes and undoped fullerenes. The metal doped fullerenes alone exhibit metallic properties and the undoped fullerenes alone exhibit semiconductor properties.

In other embodiments of the present invention, the undoped fullerene layer 2 may also be a monolayer. Similarly, in other embodiments of the present invention, the undoped fullerene layer 2 may be more than two molecules thick. Likewise, in other embodiments of the present invention, the doped fullerene layer 3 may be more than one molecule thick. In alternative embodiments of the present invention, different fullerenes may be employed, such as C82, for example. As indicated earlier, the doping of the fullerenes constituting the doped fullerene layer 3 is in the concentration of 1 Li atom per C60. However, different concentrations of electron donors may be employed in other embodiments of the present invention. Doping with more than one atom per C60 is equally possible. Other metals may be employed together with or in place of Li. Group 1 elements such as sodium (Na), potassium (K), otherwise known as the alkali metals, and elements such as lanthanum (La) are examples of possible alternatives. It will be appreciated then that Fermi levels and other relevant energy levels can be tuned by choice of dopant. Different combinations of endohedral and exohedral fullerenes are also possible in the interests of tuning barrier heights, carrier concentrations and transport properties.

The metal substrate 1 may be replaced by a semiconducting substrate such as a silicon substrate or an insulating substrate such as silicon dioxide substrate, with appropriate conductive contacts made to the undoped fullerene layer 2. Examples of such contacts may be provided by intervening metal depositions, vias, or regions of degenerate semiconductor. The fullerenes can be located in step sites on such substrates. This advantageously permits self-assembly of devices. By surface relief patterning of the substrate, such devices can then be attached and interconnected at kinks, corners and steps in the pattern. As indicated earlier, Li@C60 is an n-type material. However, the present invention equally contemplates doping fullerenes with electron acceptors to produce p-type materials.

Such junctions as those described herein are important elements of nanoscale semiconductor technology. Possible applications of junctions such as those hereinbefore described include but are not limited to electronic and optoelectronic components such as diodes, photodiodes and the like on a nanometer scale. Such elements permit fabrication of many different well-known electronic devices, such as charge-coupled devices for example, at a much higher integration density than hitherto possible.

Figure 2:
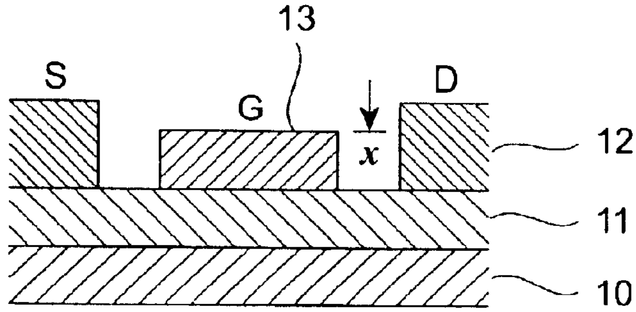
FIG. 2 is a cross sectional view of a junction field effect transistor embodying the present invention.

Referring now to FIG. 2, a junction field effect transistor (JFET) embodying the present invention comprises a silicon substrate 10. An undoped fullerene layer 11 is deposited on the substrate 10. A doped n-type fullerene layer 13 is deposited on the undoped fullerene layer 11. A metal layer 12 is also deposited on the undoped fullerene layer 11. The doped fullerene layer 13 is patterned to form a gate region G isolated from the metal layer 12 but in contact with the underlying undoped fullerene layer 11. Similarly, the metal layer 12 is patterned to form a source region S and drain region D disposed on opposite sides of the gate region 13. Both the source region S and the drain region D are in contact with the underlying undoped fullerene layer 11. In operation, a charge conduction channel between the source S and the drain D is provided by the undoped fullerene layer 11. Passage of charge between the source S and the drain D is controlled by application of control voltage to the gate region G. The voltage applied to the gate region G controls the extent to which a current limiting "pinch off" field extends into the undoped fullerene layer 11 beneath the gate region G.

Figure 3:
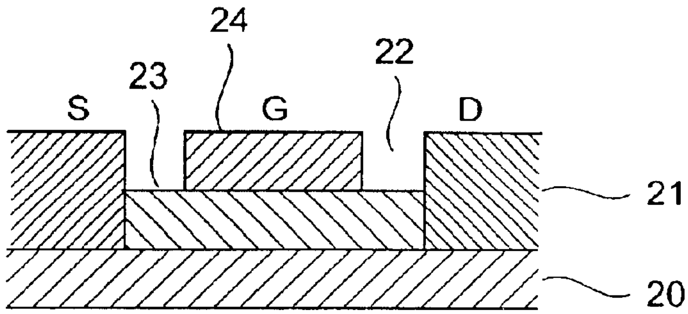
FIG. 3 is a cross sectional view of another junction field effect transistor embodying the present invention.

Referring now to FIG. 3, another JFET embodying the present invention also comprises a silicon substrate 20. A metal layer 21 is deposited on the silicon substrate 20 and patterned to provide a source region S and a drain region D disposed on opposite sides of an intervening aperture 22. An undoped fullerene layer 23 is deposited on the substrate 20 in the aperture 22. A doped n-type fullerene layer 24 is deposited on the undoped fullerene layer 23. The doped fullerene layer 24 is patterned to form a gate region G isolated from the source S and the drain D. In operation, a charge conduction channel between the source S and the drain D is again provided by the undoped fullerene layer 23, and passage of charge between the source S and the drain D is again controlled by application of control voltage to the gate region G, as hereinbefore described with reference to FIG. 2.

In the JFETs hereinbefore described with reference to FIGS. 2 and 3, the undoped fullerene layer is formed from C60. The doped fullerene layer is a monolayer formed from Li@C60. The doping of the fullerenes constituting the doped fullerene layer 3 is in the concentration of 1 Li atom per C60. The thickness x of the gate region G is one monolayer. The gate region in plan view is a square of side in the region of 10 nm (10 molecules).

In other JFETs embodying the present invention, a different fullerene may be employed, such as C82, for example. Similarly, in other JFETs embodying the present invention, other dopant metals may be employed together with or place of Li. Group 1 elements such as Na, K, otherwise known as the alkali metals, and elements such as La, are examples of possible alternatives. Likewise, different concentrations of electron donors may be employed in other embodiments of the present invention. It should also be realized that, in other JFETs embodying the present invention, the gate region may be greater than one monolayer thick. Similarly, in other JFETs embodying the present invention, the gate region may have a different shape and dimensions to those hereinbefore described with reference FIGS. 2 and 3. Also, in other JFETs embodying the present invention, the undoped fullerene layer may be greater than one molecule thick.

In particularly preferred examples of the JFETs hereinbefore described with reference to FIGS. 2 and 3, the underlying substrate is stepped to facilitate self assembly of the fullerene layers. The preferred embodiments of the present invention hereinbefore described with reference to FIGS. 2 and 3, a silicon substrate was employed. However, in other embodiments of the present invention, a different substrate material may be employed, such as silicon dioxide for example.

Figure 4:
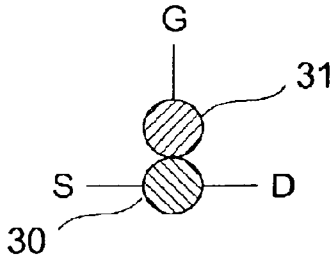
FIG. 4 is a plan view of another junction field effect transistor embodying the present invention.
Figure 5:
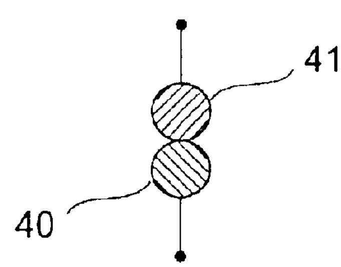
FIG. 5 is a cross sectional view of a junction diode embodying the present invention.

Referring now to FIG. 4, yet another JFET embodying the present invention comprises a single undoped fullerene 30 adjacent a single doped fullerene 31. The doped fullerene 31 is doped with an n-type dopant. In operation, the undoped fullerene 30 forms the conduction channel of the JFET extending between source S and drain D, and the doped fullerene 31 forms the gate region G of the JFET. Turning to FIG. 5, another diode embodying the present invention comprises a single undoped fullerene 40 adjacent a single doped fullerene 41. The doped fullerene 41 is doped with an n-type dopant. In operation, the undoped fullerene 40 is connected to the anode of the diode and the doped fullerene is connected to the cathode. In both the FIG. 4 JFET and FIG. 5 diode, the undoped fullerene 30 is C60 and the doped fullerene is Li@C60. However, it will be appreciated that different fullerenes and dopants may be employed.

In the embodiments of the present invention hereinbefore described, junctions are formed between metal-doped and undoped fullerenes. However, in other embodiments of the present invention, both similar and different devices may be produced by forming junctions between metal-doped fullerenes in which the dopants and/or doping concentrations differ. Accordingly, embodiments of the present invention include device structures involving n-$n^+$, p-$p^+$, and many other junctions. By combining p-type and n-type doped fullerene layers, n-p-n and p-n-p bipolar transistor structures with nanometer dimensions can be produced. Similarly, quantum well heterostructures can be made by stacking appropriately doped fullerene layers.

EXAMPLES

Examples of test junctions and their corresponding I/V characteristics will now be described with reference to FIGS. 6 to 10. These junctions are intended to be examples only and not to limit the invention as claimed in any way.

Figure 6:
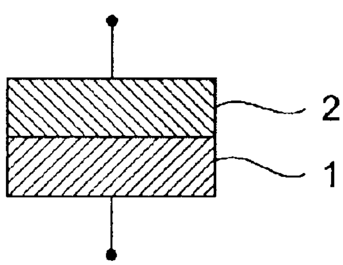
FIG. 6 is a cross sectional view of a C60/Au(110) junction.
Figure 7:
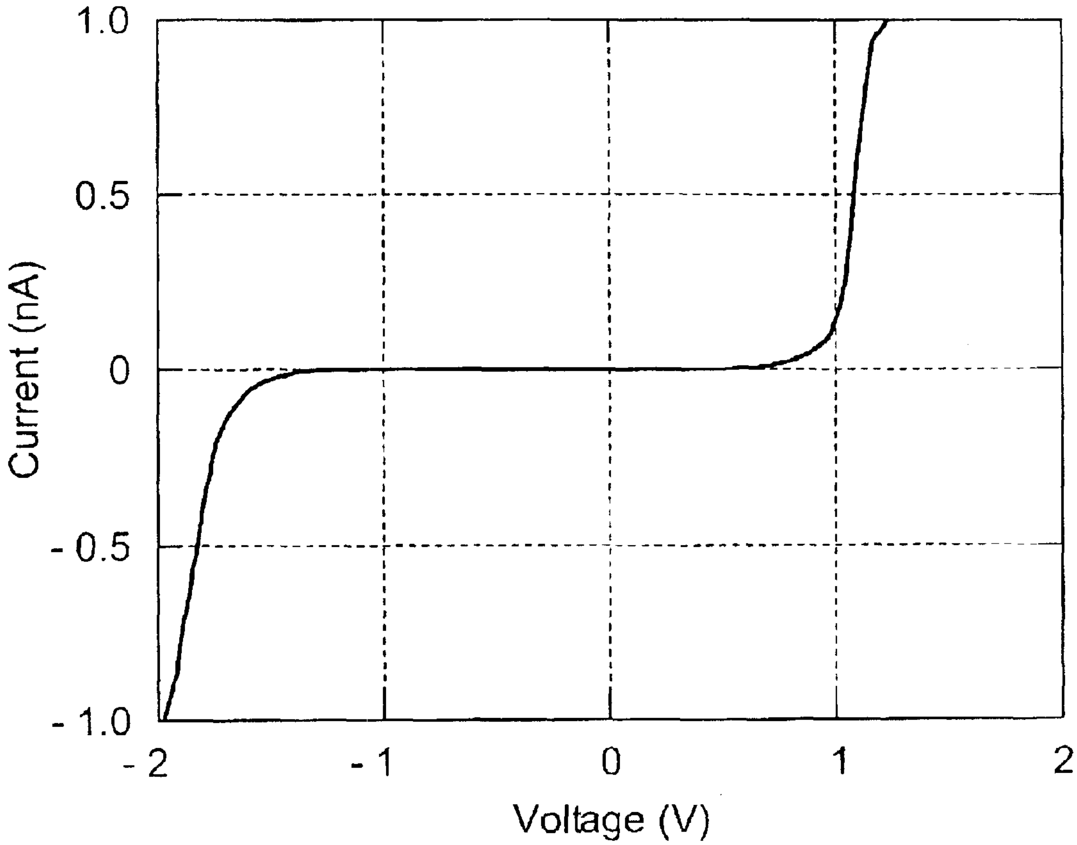
FIG. 7 is an I/V characteristic curve corresponding to the C60/Au(110) junction.

Referring first to FIG. 6, a first test junction was produced by depositing an undoped fullerene layer 2 on a metal substrate. The metal substrate 1 was formed from gold, Au(110), and the undoped fullerene layer 2 was a two molecule thick layer of C60. With reference to FIG. 7, I/V spectroscopy testing of the junction with a scanning tunneling microscope revealed an I/V characteristic typically associated with a semiconductor. Specifically, the observed I/V characteristic exhibited tunneling breakdown in both reverse biased and forward biased directions and substantially zero gradient through the origin.

Figure 8:
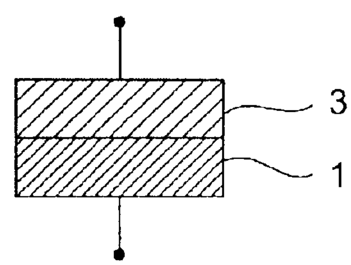
FIG. 8 is a cross sectional view of a Li@C60/Au(110) junction.
Figure 9:
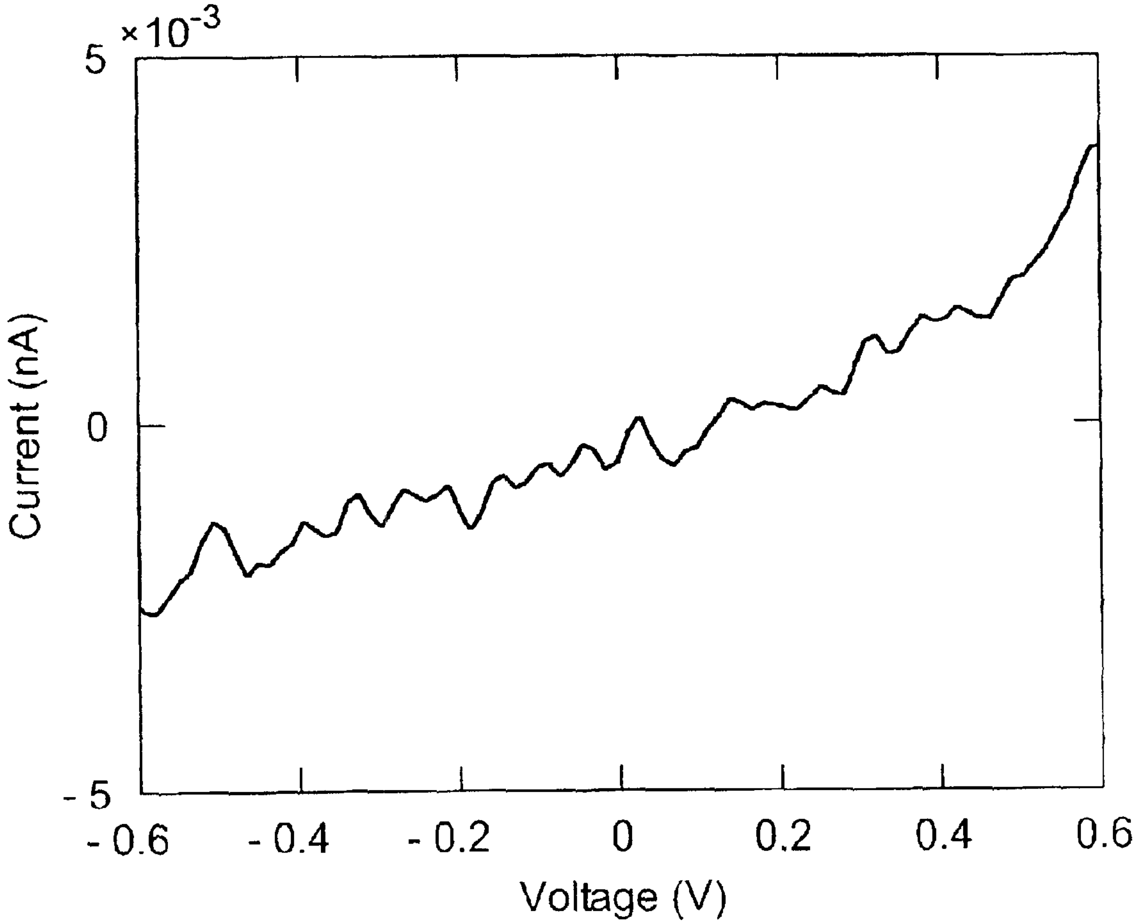
FIG. 9 is an I/V characteristic curve corresponding to the Li@C60/Au(110) junction; and, FIG. 10 is an I/V characteristic curve corresponding to the FIG. 1 diode when constituted by an Li@C60/C60/Au(110) junction.

Referring now to FIG. 8, a second test junction was produced by depositing a doped fullerene layer 3 on a metal substrate 1. The metal substrate 1 was again formed from Au(110) and the doped fullerene layer 3 was a 1 molecule thick (0.7 nm) layer of Li@C60. With reference to FIG. 9, I/V spectroscopy testing of the junction with a scanning tunneling microscope revealed an I/V characteristic typically associated with an ohmic conductor such as a metal. Specifically, the observed I/V characteristic exhibited a non zero and substantially linear gradient through the origin.

Figure 10:
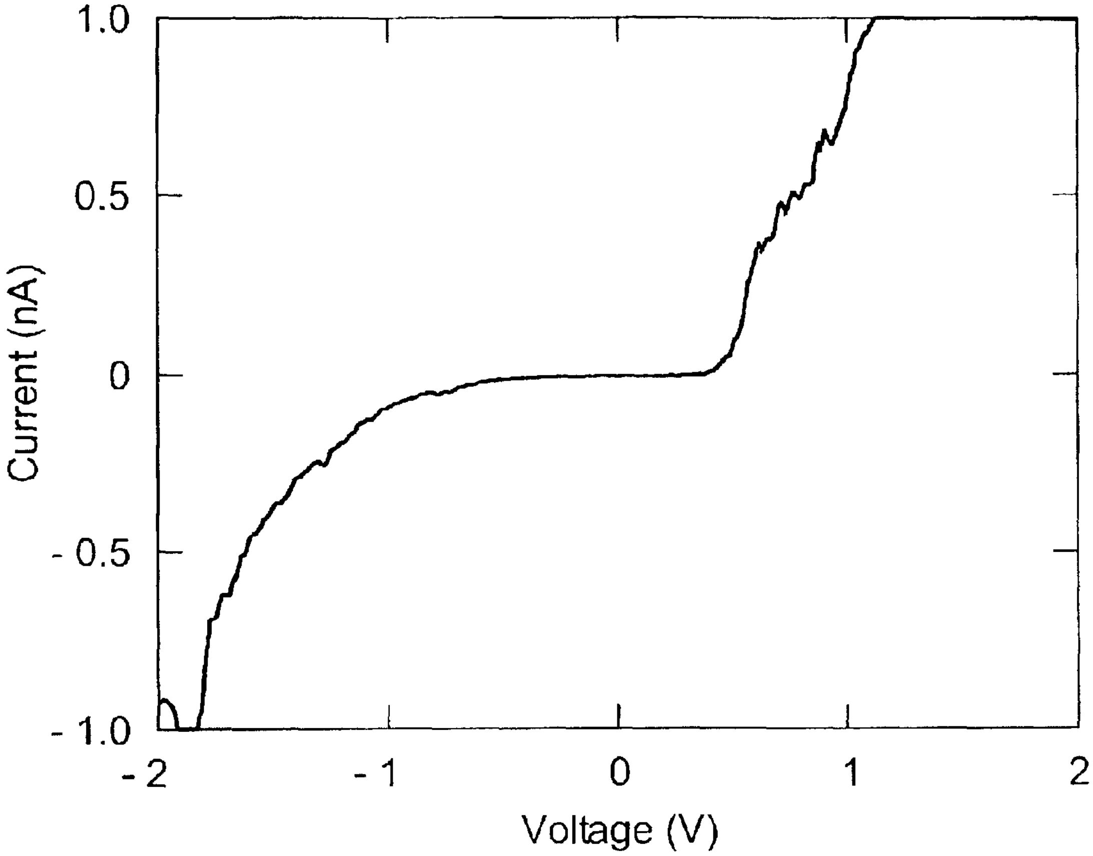

With reference again to FIG. 1, a third test junction was produced by depositing an undoped fullerene layer 2 and a doped fullerene layer 3 on a metal substrate 1, with the undoped fullerene layer 2 disposed between the metal substrate 1 and the doped fullerene layer 3. The metal substrate 1 was again formed from Au(110). The undoped fullerene layer 2 was a two molecule thick layer of C60. The doped fullerene layer 3 was a 1 molecule thick layer of Li@C60. With reference to FIG. 10, I/V spectroscopy testing of the junction with a scanning tunneling microscope revealed an I/V characteristic typically associated with a Schottky diode. Specifically, the observed I/V characteristic exhibited thermionic emission in the forward biased direction, tunneling breakdown in the reverse biased direction, and a substantially zero gradient through the origin.

What is claimed is:

1. An electronic device comprising a junction formed between a first fullerene layer having a first doping concentration and a second fullerene layer having a second doping concentration different from the first doping concentration.

2. A device as claimed in claim 1, wherein the first doping concentration is zero.

3. A device as claimed in claim 1, wherein the second fullerene layer is a monolayer.

4. A device as claimed in claim 1, wherein the first fullerene layer is a monolayer.

5. A device as claimed in claim 1, wherein the second fullerene layer comprises an electron donor dopant.

6. A device as claimed in claim 1, wherein the second fullerene layer comprises an alkali metal or lanthanum dopant.

7. A device as claimed in claim 6, wherein the second doping concentration is in the region of $10^{21}$ per $cm^3$.

8. A device as claimed in claim 7 in the form of a diode wherein the first fullerene layer is connected to an anode and the second fullerene layer is connected to a cathode.

9. A device as claimed in claim 1 in the form of a field effect transistor wherein the first fullerene layer serves as a gate region and the second fullerene layer serves as a channel region extending between a source terminal and a drain terminal.

10. A device as claimed in claim 1, wherein the second fullerene layer comprises an electron acceptor dopant.

11. A device as claimed in claim 1, wherein at least one of the first and second fullerene layers is formed from C60 or C82.

12. A device as claimed in claim 1, wherein at least one of the first and second fullerene layers consists of a single bucky ball.

13. An electronic device comprising a junction formed between a first fullerene layer having a first doping concentration and a second fullerene layer having a second doping concentration different from the first doping concentration, wherein at least one of the first and second fullerene layers is a monolayer.

14. The device as claimed in claim 13, wherein the second fullerene layer comprises an electron donor dopant having a concentration of about $10^{21}$ per $cm^3$.

15. The device as claimed in claim 13, wherein the second fullerene layer comprises a metal dopant selected from the group consisting of Li, Na, K and La.

16. A method for fabricating an electronic device comprising forming a junction between a first fullerene layer having a first doping concentration and a second fullerene layer having a second doping concentration different from the first doping concentration.

17. The method as claimed in claim 16, further comprising forming at least one of the first and second fullerene layers as a monolayer.

18. The method as claimed in claim 16, further comprising doping the second fullerene layer with an electron donor dopant.

19. The method as claimed in claim 16, further comprising doping the second fullerene layer with an alkali metal or lanthanum dopant.

20. The method as claimed in claim 16, further comprising forming at least one of the first and second fullerene layers from C60, C82 or a single bucky ball.

* * * * *